US008865582B2

(12) United States Patent
Loo et al.

(10) Patent No.: US 8,865,582 B2
(45) Date of Patent: Oct. 21, 2014

(54) METHOD FOR PRODUCING A FLOATING GATE MEMORY STRUCTURE

(75) Inventors: Roger Loo, Leuven (BE); Matty Caymax, Leuven (BE); Pieter Blomme, Oostende (BE); Geert Van den Bosch, Leuven (BE)

(73) Assignee: IMEC, Leuven (BE)

( * ) Notice: Subject to any disclaimer, the term of this patent is extended or adjusted under 35 U.S.C. 154(b) by 106 days.

(21) Appl. No.: 13/280,546

(22) Filed: Oct. 25, 2011

(65) Prior Publication Data

US 2012/0112262 A1     May 10, 2012

Related U.S. Application Data

(60) Provisional application No. 61/413,609, filed on Nov. 15, 2010.

(30) Foreign Application Priority Data

Nov. 8, 2010   (EP) .................................... 10190373

(51) Int. Cl.

| H01L 29/788 | (2006.01) |
| H01L 21/336 | (2006.01) |
| H01L 27/115 | (2006.01) |
| H01L 29/423 | (2006.01) |
| H01L 21/28 | (2006.01) |
| H01L 29/49 | (2006.01) |

(52) U.S. Cl.
CPC ..... *H01L 27/11521* (2013.01); *H01L 29/42324* (2013.01); *H01L 21/28273* (2013.01); *H01L 29/4916* (2013.01)
USPC ........... 438/594; 257/316; 257/314; 257/321; 257/377; 257/382; 438/257; 438/261; 438/263; 438/264

(58) Field of Classification Search
USPC .......... 257/316, 314, 321, 377, 382, E21.422, 257/E29.3; 438/594, 257, 261, 263, 264
See application file for complete search history.

(56) References Cited

U.S. PATENT DOCUMENTS 5,106,772 A * 4/1992 Lai ................................ 438/263
5,262,277 A * 11/1993 Sato et al. .................. 430/283.1

(Continued)

OTHER PUBLICATIONS

J. Brewer and M. Gill, eds., "Nonvolatile Memory Technologies with Emphasis on Flash: a Comprehensive Guide to Understanding and Using NVM Devices," IEEE Press Series on Microelectronic Systems, 227-237 (2007).

(Continued)

*Primary Examiner* — Thao X Le
*Assistant Examiner* — Sheng Zhu
(74) *Attorney, Agent, or Firm* — McDonnell Boehnen Hulbert & Berghoff LLP

(57) ABSTRACT

Disclosed are methods for manufacturing floating gate memory devices and the floating gate memory devices thus manufactured. In one embodiment, the method comprises providing a monocrystalline semiconductor substrate, forming a tunnel oxide layer on the substrate, and depositing a protective layer on the tunnel oxide layer to form a stack of the tunnel oxide layer and the protective layer. The method further includes forming at least one opening in the stack, thereby exposing at least one portion of the substrate, and cleaning the at least one exposed portion with a cleaning liquid. The method still further includes loading the substrate comprising the stack into a reactor and, thereafter, performing an in-situ etch to remove the protective layer, using the at least one exposed portion as a source to epitaxially grow a layer comprising the monocrystalline semiconductor material, and forming the layer into at least one columnar floating gate structure.

13 Claims, 6 Drawing Sheets

(56) References Cited

U.S. PATENT DOCUMENTS

| | | | |
|---|---|---|---|
| 5,310,624 A * | 5/1994 | Ehrlich | 430/322 |
| 5,472,564 A * | 12/1995 | Nakamura et al. | 216/51 |
| 5,672,901 A * | 9/1997 | Abernathey et al. | 257/413 |
| 5,817,174 A * | 10/1998 | Tomita et al. | 117/97 |
| 6,114,723 A * | 9/2000 | Leu | 257/316 |
| 6,133,096 A * | 10/2000 | Su et al. | 438/264 |
| 6,509,232 B1 * | 1/2003 | Kim et al. | 438/264 |
| 7,001,814 B1 * | 2/2006 | Halliyal et al. | 438/287 |
| 7,166,510 B2 * | 1/2007 | Lee | 438/257 |
| 8,030,108 B1 * | 10/2011 | Lee et al. | 438/44 |
| 2003/0011018 A1 * | 1/2003 | Hurley | 257/314 |
| 2005/0142725 A1 | 6/2005 | Jung et al. | |
| 2006/0042651 A1 * | 3/2006 | Verhaverbeke et al. | 134/1 |
| 2008/0200007 A1 * | 8/2008 | Lim et al. | 438/430 |
| 2009/0233406 A1 * | 9/2009 | Shon | 438/264 |
| 2009/0261398 A1 * | 10/2009 | Chien et al. | 257/316 |
| 2010/0052035 A1 | 3/2010 | Koike et al. | |
| 2010/0187594 A1 | 7/2010 | Mizukami et al. | |

OTHER PUBLICATIONS

European Search Report, European Patent Application 10190373, dated Feb. 25, 2011.

* cited by examiner

METHOD FOR PRODUCING A FLOATING GATE MEMORY STRUCTURE

CROSS-REFERENCE TO RELATED APPLICATION

This application is a non-provisional of U.S. Provisional Patent Application Ser. No. 61/413,609 filed Nov. 15, 2010, the contents of which are hereby incorporated by reference. Further, this application claims priority to European Patent Application Serial No. 10190373 filed Nov. 8, 2010, the contents of which are hereby incorporated by reference.

BACKGROUND

Though various types of floating gate non-volatile memory devices exist, many require obtaining a thin tunnel oxide layer on a semiconductor substrate, mostly commonly a silicon substrate. For example, Hurley (U.S. Patent Publication No. 2003/0011018) describes a method in which openings are made in a tunnel oxide layer and monocrystalline silicon is epitaxially grown over the tunnel oxide with the openings serving as seed areas for the epi-growth. This is an example of so-called selective epitaxial growth of silicon during which the nucleation of polycrystalline silicon on top of, for example, silicon nitride/oxide layers is prevented. The monocrystalline material will form the actual floating gate in the finished device.

In selective epitaxial growth, it is important to clean the seed areas and to remove the native oxide before the epi-growth begins. This conventional cleaning process usually comprises a wet chemical clean having a last step treatment with aqueous solutions containing hydrogen fluoride, a so-called 'HF dip'. However, this step may cause uncontrolled thinning of the tunnel oxide, which may lead to reproducibility issues, and possibly the appearance of areas of non-uniform tunnel oxide thickness.

In some flash memory devices, arrays of columnar floating gate structures are produced from polysilicon to have a certain thickness between parallel sidewalls. An oxide-nitride-oxide (ONO) inter-poly dielectric runs along the sidewalls of the floating gate in order to provide a large capacitance between floating gate and control gate and therefore a large coupling ratio.

In order to scale the cell, it is necessary to reduce one or more of the length of the floating gate, the length of the control gate, and the thickness of the inter-poly dielectric. For scaled devices, the length of the structures are becoming smaller and the patterns denser. The limit of scaling would be given by a half-pitch filled by the inter-poly dielectric (on both sides). This implies that the pitch of floating gates (defined as the sum of the floating gate length and the space between two adjacent floating gates) cannot be scaled below a value which corresponds to the sum of the floating gate length (scalable to about 5 nm), the control gate length (scalable to about 5 nm), and two times the ONO inter-poly thickness (scalable to about 15 nm). This gives a total sum of about 40 nm and therefore a limit of scaling of 20 nm half-pitch, meaning a half-pitch below 20 nm is difficult to achieve. While this value could be reduced by making a thinner vertical inter-poly dielectric, but this is not trivial for the ONO stacks typically in use.

Floating gate memory devices may be operated array in a manner similar to NAND memories, as described, for example, in "Nonvolatile Memory Technologies with Emphasis on Flash: a Comprehensive Guide to Understanding and Using NVM Devices," IEEE Press Series on Microelectronic Systems, pp. 227-237 (J. Brewer and M. Gill, eds., 2007).

SUMMARY

Disclosed are methods for manufacturing floating gate memory devices. Also disclosed are the floating gate memory devices manufactured using the disclosed methods.

In one embodiment, a method is disclosed that comprises providing a monocrystalline semiconductor substrate and forming a tunnel oxide layer on the substrate. The method further comprises depositing a protective layer over the tunnel oxide layer, thereby forming a stack comprising the tunnel oxide layer and the protective layer. The method still further comprises forming at least one opening in the stack, thereby exposing at least one exposed portion of the substrate, and cleaning the at least one exposed portion using a cleaning liquid, where the protective layer is substantially unaffected by the cleaning liquid. The method further includes loading the substrate comprising the stack into a reactor and, thereafter, removing the protective layer by an in-situ etching process that is selective with respect to the tunnel oxide layer, epitaxially growing a monocrystalline semiconductor layer using the at least one exposed portion as a source, and forming the semiconductor layer into at least one floating gate structure.

In some embodiments, the method may further include, after loading the substrate into the reactor, annealing the substrate to remove any oxide from the at least one exposed portion.

In some embodiments, the substrate may comprise silicon. Further, the tunnel oxide layer may comprise silicon dioxide ($SiO_2$), such as thermally-grown silicon dioxide. The protective layer may comprise amorphous or polycrystalline silicon.

In some embodiments, the cleaning liquid may comprise hydrogen fluoride (HF).

In some embodiments, the in-situ etching process may comprise exposing the stack to a halogen containing precursor, such as hydrogen chloride (HCl) or chlorine ($Cl_2$).

In some embodiments, the in-situ etching process being selective with respect to the tunnel oxide layer may comprise the in-situ etching process having a selectivity for the protective layer over the tunnel oxide layer of about 100:1.

In some embodiments, forming the semiconductor layer into at least one floating gate structure may comprise planarizing the semiconductor layer, depositing on the planarized semiconductor layer a hard mask layer comprising a dielectric material, depositing a resist layer on the hard mask layer, patterning the resist layer, etching the hard mask layer and the planarized semiconductor layer, thereby forming at least one floating gate structure. In some embodiments, the tunnel oxide layer substantially unaffected by the etch of the hard mask layer and the planarized semiconductor layer.

In some embodiments, the at least one floating gate structure may comprise at least two columnar floating gate structure. In these embodiments, the method may further comprise etching trenches between the at least two columnar floating gate structures and filling the trenches with a dielectric material, thermally growing an oxide layer on sides of the at least two columnar floating gate structures, and depositing a control gate layer between and on top of the at least two columnar floating gate structures.

The thermally-grown oxide layer may have a thickness between about 5 nm and about 15 nm, or between about 5 nm and about 10 nm, or even between about 6 nm and about 8 nm.

Further, a half-pitch of the at least two columnar floating structures may be between about 10 nm and about 20 nm, or between about 10 nm and about 15 nm, or even between about 11 nm and about 13 nm.

In another aspect, a method is disclosed comprising providing a monocrystalline semiconductor substrate and forming a tunnel oxide layer on the substrate. The method further comprises forming at least one opening in the tunnel oxide layer, thereby forming at least one exposed portion of the substrate, and cleaning the at least one exposed portion using a cleaning liquid. The method further includes loading the substrate comprising the tunnel oxide layer into an epitaxial reactor and, thereafter, epitaxially growing a monocrystalline semiconductor layer using the at least one exposed portion as a source, planarizing the semiconductor layer, depositing on the planarized semiconductor layer a hard mask layer comprising a dielectric material etching the planarized semiconductor layer, thereby forming at least two floating gate structures. The method further comprises etching trenches between the at least two columnar floating gate structures and filling the trenches with a dielectric material, thermally growing an oxide layer on sides of the at least two columnar floating gate structures, and depositing a control gate layer between and on top of the at least two columnar floating gate structures.

In some embodiments, the method may further include, after loading the substrate into the epitaxial reactor, annealing the substrate to remove any oxide from the at least one exposed portion.

In some embodiments, the tunnel oxide layer substantially unaffected by the etch of the hard mask layer and the planarized semiconductor layer.

In some embodiments, the method may further include, after forming the tunnel oxide layer, depositing a protective layer over the tunnel oxide layer, thereby forming a stack comprising the tunnel oxide layer and the protective layer. In these embodiments, forming the at least one opening in the tunnel oxide layer may comprise forming the at least one opening in the stack. In these embodiments, the method may further comprise, after loading the substrate into the epitaxial reactor and before epitaxially growing the semiconductor layer, removing the protective layer by an in-situ etching process that is selective with respect to the tunnel oxide layer. In some embodiments, the in-situ etching process being selective with respect to the tunnel oxide layer may comprise the in-situ etching process having a selectivity for the protective layer over the tunnel oxide layer of about 100:1.

In some embodiments, the substrate may comprise silicon. Further, the tunnel oxide layer may comprise silicon dioxide ($SiO_2$), such as thermally-grown silicon dioxide. The protective layer may comprise amorphous or polycrystalline silicon.

In some embodiments, the cleaning liquid may comprise hydrogen fluoride (HF).

In some embodiments, the in-situ etching process may comprise exposing the stack to a halogen containing precursor, such as hydrogen chloride (HCl) or chlorine ($Cl_2$).

In some embodiments, the in-situ etching process being selective with respect to the tunnel oxide layer may comprise the in-situ etching process having a selectivity for the protective layer over the tunnel oxide layer of about 100:1.

The thermally-grown oxide layer may have a thickness between about 5 nm and about 15 nm, or between about 5 nm and about 10 nm, or even between about 6 nm and about 8 nm. Further, a half-pitch of the at least two columnar floating structures may be between about 10 nm and about 20 nm, or between about 10 nm and about 15 nm, or even between about 11 nm and about 13 nm.

In yet another aspect, a floating gate memory device is disclosed that comprises at least one array comprising a number of columnar floating gate structures comprising a monocrystalline semiconductor material. The floating gate memory device further comprises a number of control gate structures formed between each of the columnar floating gate structures. Each columnar floating gate structure comprises lateral sides on which oxide layers are formed, such that each floating gate structure is electrically isolated from one another. The oxide layers have a thickness between about 5 nm and about 15 nm, or between about 5 nm and about 10 nm, or even between about 6 nm and about 8 nm. Further, a half-pitch of the array of columnar floating structures is between about 10 nm and about 20 nm, or between about 10 nm and about 15 nm, or even between about 11 nm and about 13 nm.

DETAILED DESCRIPTION

With reference to FIGS. 1A-1M, an example method of manufacturing a floating gate memory device is illustrated. While an example floating gate memory device is shown, it is to be understood that the invention is not so limited, and that the disclosed floating gate memory device could be other floating gate memory devices are possible as well.

Figure 1A:
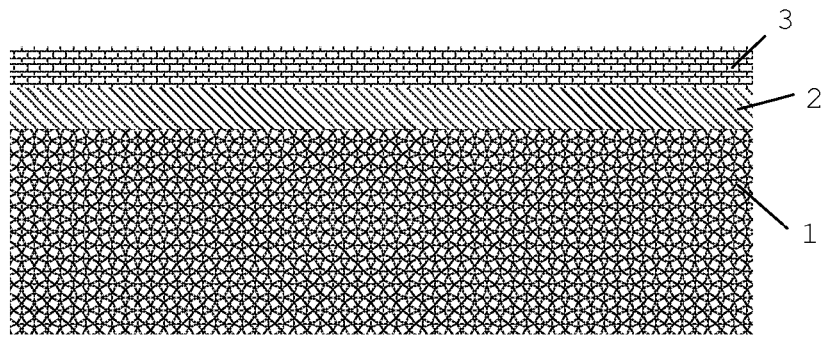
FIGS. 1A-1M illustrate the process flow of the fabrication of a floating gate memory device according to the method of the invention.

As shown in FIG. 1A, a monocrystalline semiconductor substrate 1 is provided. The substrate 1 may be, for example, a monocrystalline silicon substrate. A tunnel oxide layer 2 is formed on the substrate 1. The tunnel oxide layer 2 may comprise, for example, silicon dioxide and may be formed by, for example, thermal oxidation of the substrate. The tunnel oxide layer may have a thickness between about 5 nm and about 10 nm.

A protective layer 3 is then formed on the tunnel oxide layer 2, as shown. The protective layer 3 may comprise, for example, amorphous or polycrystalline silicon and may be formed by, for example, chemical vapor deposition on the tunnel oxide layer 2. The protective layer 3 may have a thickness of, about, a few nm. The protective layer 3 and the tunnel oxide layer 2 may form a stack. In some embodiments, no such protective layer 3 may be formed.

Figure 1B:
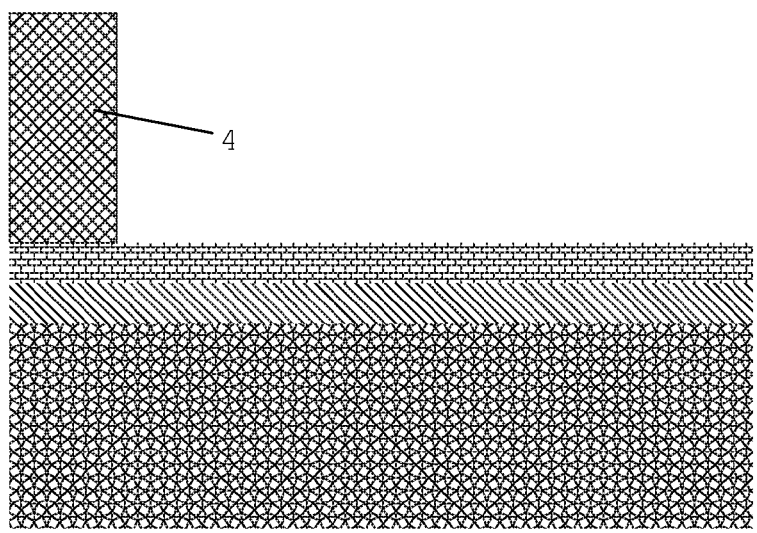

In FIG. 1B, a stop structure 4 is formed on the protective layer 3 (or, in embodiments in which no protective layer 3 is formed, on the tunnel oxide layer 2). While only one stop structure 4 is shown, multiple stop structures may be formed. The stop structure 4 may serve to stop a chemical mechanical polish. In some embodiments, the stop structure 4 may comprise, for example, silicon nitride ($Si_3N_4$) and may be formed by, for example, depositing a layer of silicon nitride and then patterning the silicon nitride to define one or more protrusions to act as the stop structure 4. In embodiments where the stop structure 4 comprises stoichiometric silicon nitride, silicon does not nucleate on the stop structure 4.

In some embodiments, rather than being formed on the protective layer 3, the stop structure 4 may be formed directly on the substrate 1 prior to the tunnel oxide layer 2 and the protective layer 3. The tunnel oxide layer 2 and the protective layer 3 may then be formed on the substrate 1 comprising the stop structure 4.

Figure 1C:
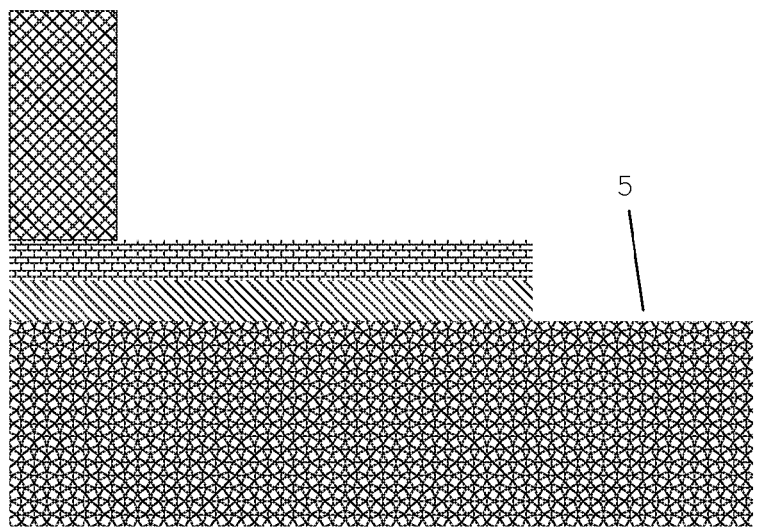

As shown in FIG. 1C, at least one opening is formed in the stack (i.e., in the tunnel oxide layer 2 and the protective layer 3 or, in embodiments in which no protective layer 3 is formed, in the tunnel oxide layer 2). As a result of forming the opening, an portion 5 of the substrate may be exposed. While only one exposed portion 5 is shown, in other embodiments more portions of the substrate may be exposed.

The at least one opening may be formed by, for example, a lithography and dry etch process followed by a post-etch wet clean (e.g., strip) process. Following the post-etch wet clean, the exposed portion 5 may be covered by a native oxide layer, in which case the native oxide layer may be removed by a wet chemical clean, such as a hydrogen fluoride dip. The protective layer 3 may protect the tunnel oxide layer 2 during the hydrogen fluoride dip, such that the tunnel oxide layer 2 remains substantially unaffected by the hydrogen fluoride. In some cases, at the lateral sides of the exposed portions 5, the tunnel oxide layer 2 may be slightly etched by the hydrogen fluoride dip; however, at the portions of the tunnel oxide layer 2 where the floating gate structures will be formed, as described below, the thickness of the tunnel oxide layer 2 will be unchanged.

The substrate 1 comprising the stack 2, 3 may then be loaded into a reactor, such as an epitaxial reactor. In some embodiments, the substrate 1 comprising the stack 2, 3 may be annealed at a temperature between, for example, about 600° C. and about 1050° C., such as about 850° C. Such an anneal may serve to remove from the exposed portions 5 of the substrate 1 any oxides that may have formed between the hydrogen fluoride dip and the loading of the substrate 1 comprising the stack 2, 3 into the reactor. In embodiments where the protective layer 3 comprises an amorphous silicon layer, the anneal may also serve to change the amorphous silicon to polysilicon. Alternately, in some embodiments, no anneal may take place.

Figure 1D:
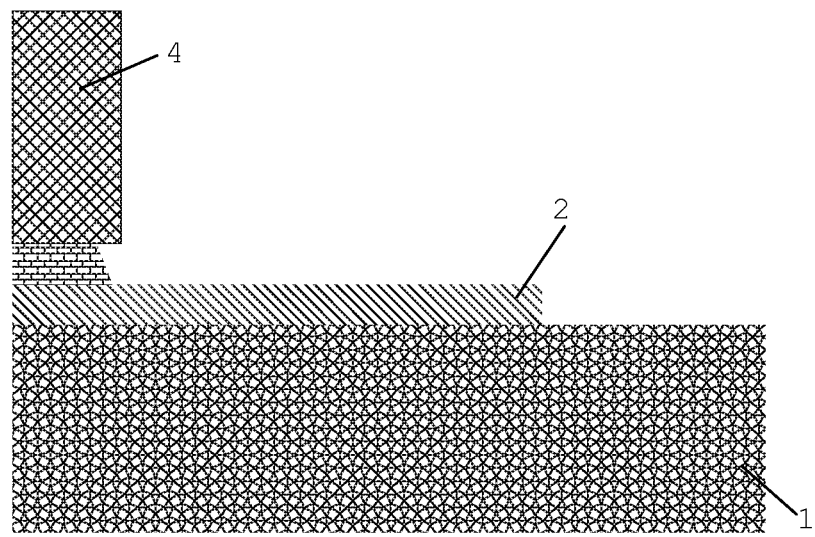

As shown in FIG. 1D, the protective layer 3 is removed through in-situ etching. The etching is selective with respect to the tunnel oxide layer 2, such that the tunnel oxide layer 2 remains substantially unaffected by the etching. In some embodiments, the etching may include, for example, precursors containing hydrogen chloride (HCl) (or other halogen-based precursors) and may be carried out at a temperature between, for example, about 600° C. and about 1000° C., such as about 850° C.

In some embodiments, the in-situ etching process being selective with respect to the tunnel oxide layer 2 may comprise the in-situ etching process having a selectivity for the protective layer 3 over the tunnel oxide layer 2 of about 100:1. Further, the in-situ etching process may be selective with respect to the substrate 1, though may have a much lower selectivity; the in-situ etching process may have a selectivity for the protective layer 3 over the substrate 1 of about 10:1. Alternately, the in-situ etching may not be selective with respect to the substrate 1, in which case the exposed portions 5 may be cleaned to remove oxides, and additional monocrystalline semiconductor material may be grown (e.g., by selective epitaxial growth) to replace any monocrystalline semiconductor material that is etched. In embodiments where no protective layer 3 is present, the in-situ etching may not be performed.

Figure 1E:
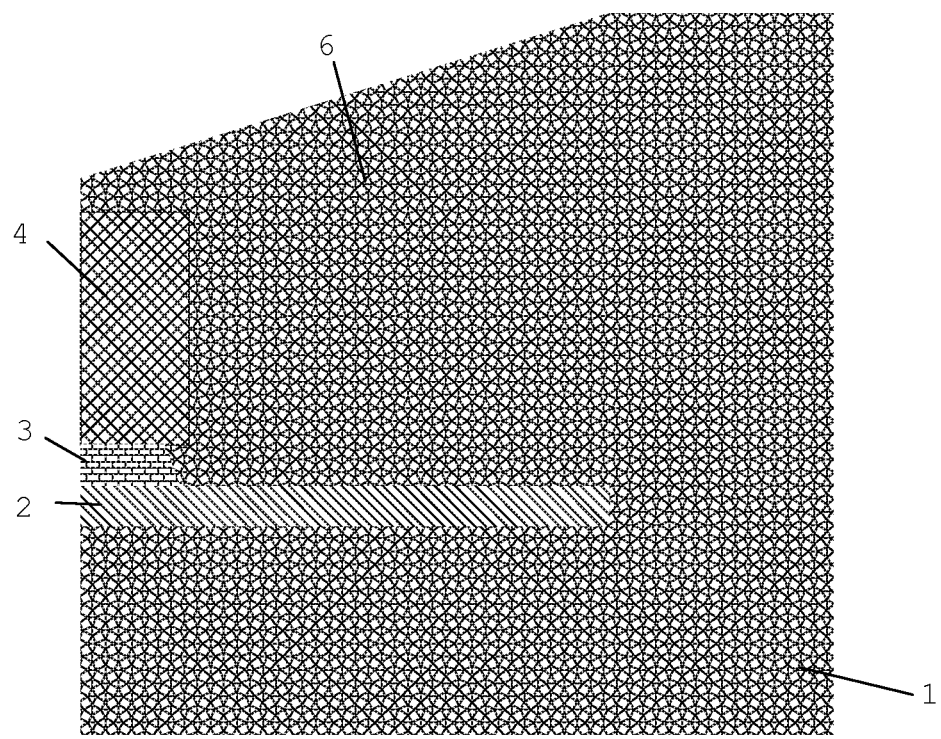

FIG. 1E illustrates selective epitaxial growth of a monocrystalline semiconductor layer 6 using the exposed portion 5 as a source. As shown, the semiconductor layer 6 extends over the tunnel oxide layer 2 to a thickness above the height of the stop structure 4. In embodiments where multiple stop structures 4 are used, more than one portion 5 of the substrate may be exposed, such that a stop structure 4 may be formed between two adjacent exposed portions 5. In these embodiments, the semiconductor layer 6 may be grown from each of the exposed portions 5, and may connect to form a border above the stop structure 4. The border may contain a number of irregularities. However, due to the stop structure 4, the border may be formed far enough from the substrate 1 to avoid any negative effects.

Figure 1F:
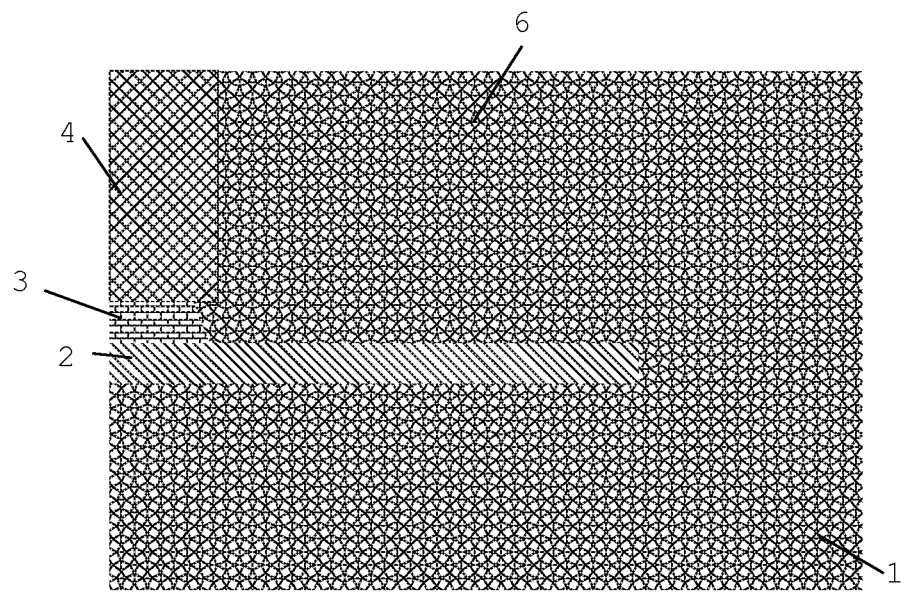
Figure 1G:
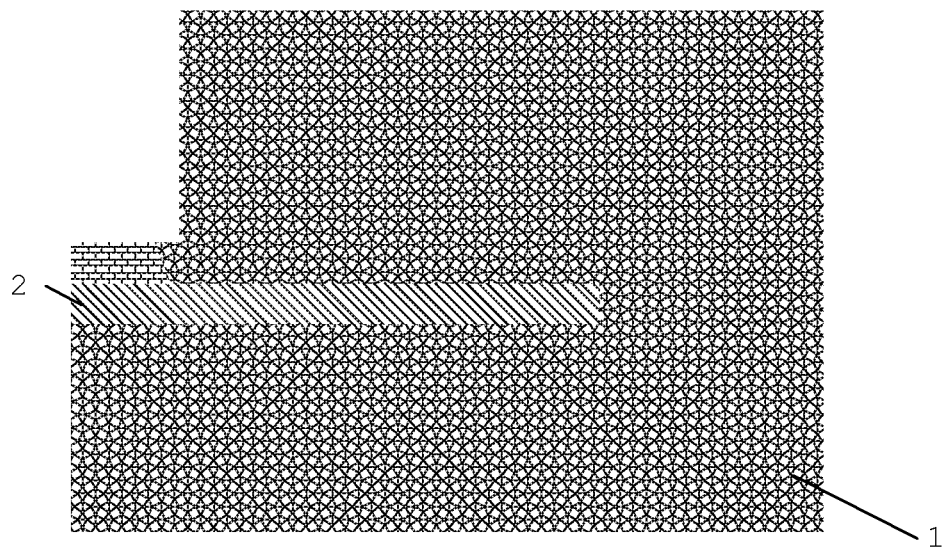

As shown in FIG. 1F, the semiconductor layer 6 may be planarized. As shown in FIG. 1G, the stop structure 4 may be removed (e.g., by a selective wet etch).

Figure 1H:
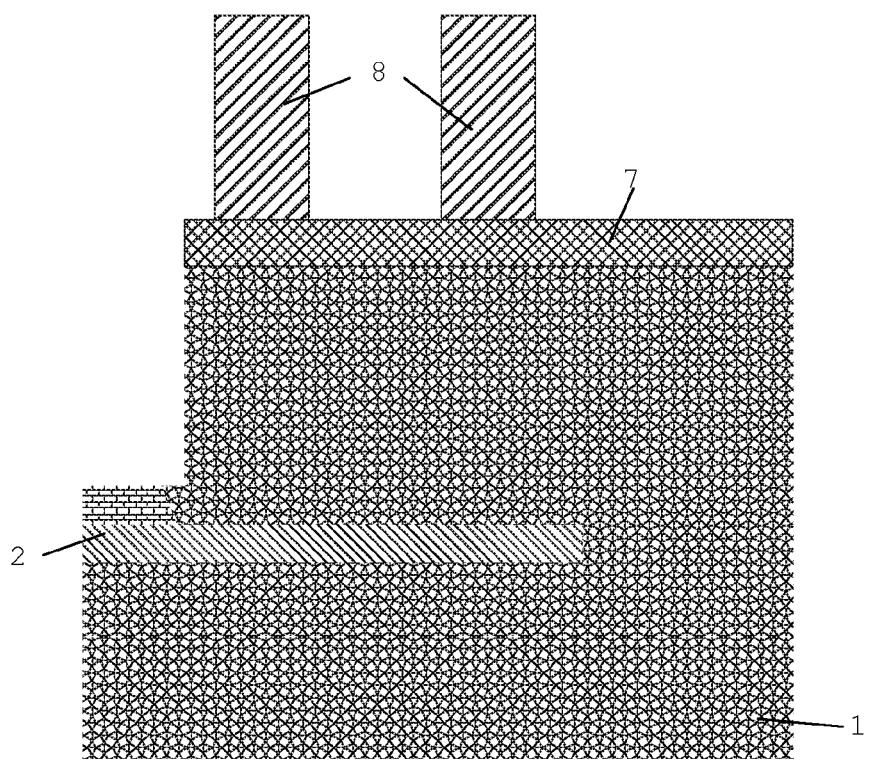

As shown in FIG. 1H, a hard mask layer 7 may be deposited on top of the planarized semiconductor layer 6. The hard mask layer 7 may comprise, for example, a dielectric material, such as silicon nitride (SiN) or silicon dioxide. Further, as shown in FIG. 1H, a resist layer 8 may be deposited on the hard mask layer 7 and patterned.

Figure 1I:
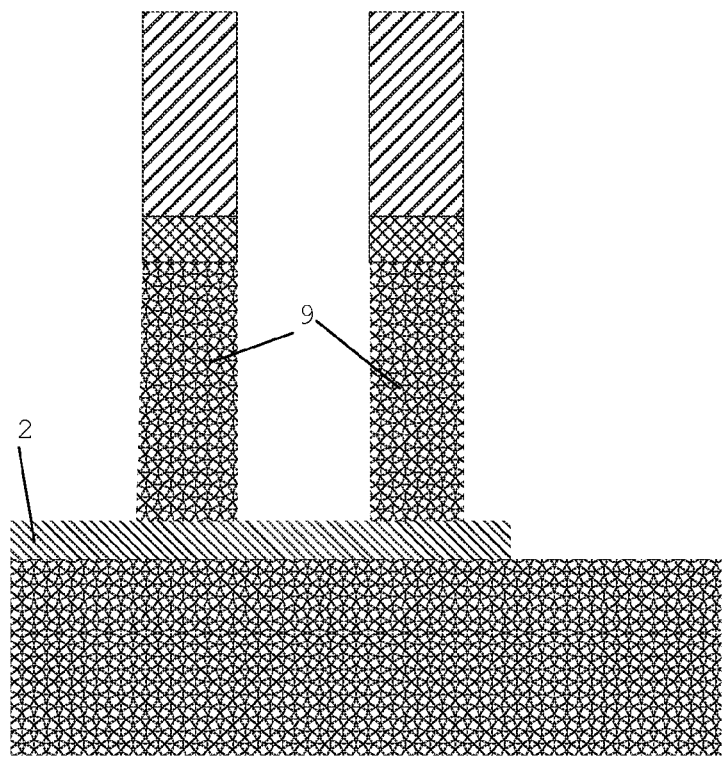

In FIG. 1I, the hard mask layer 7 and the semiconductor layer 6 are etched according to the patterned resist layer 8, such that columnar floating gate structures 9 are formed. As shown, the etch stops at the tunnel oxide layer 2. The floating gate structures 9 may have a half-pitch between about 10 nm and about 20 nm, or even between about 11 nm and about 13 nm. Further, the floating gate structures 9 may have a thickness of about 5 nm.

Figure 1J:
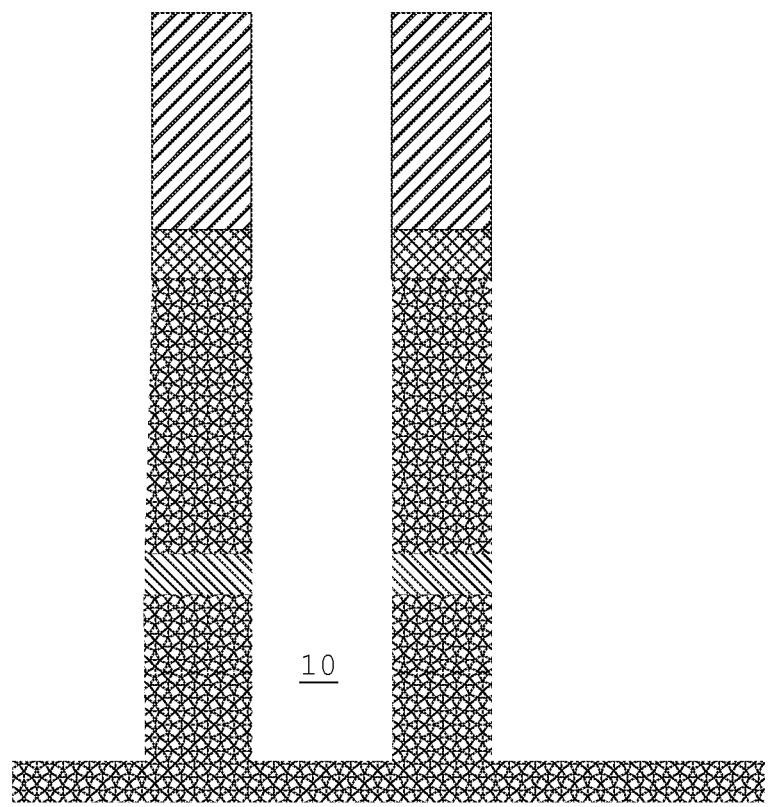
Figure 1K:
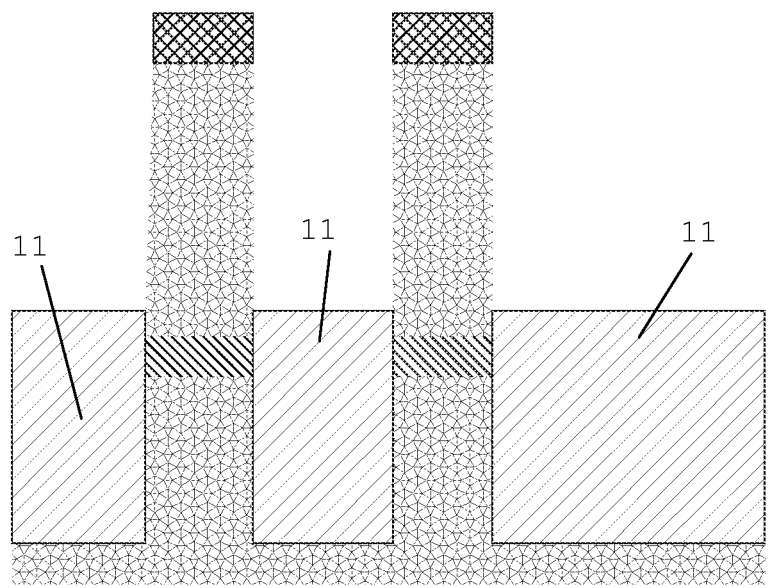

As shown in FIG. 1J, the tunnel oxide layer 2 and the substrate 1 are etched to form trenches 10. The trenches 10 may have a depth between, for example, about 300 nm and about 350 nm. In FIG. 1K, shallow trench isolation (STI) regions 11 are formed by filling the trenches 10 with an insulating material, such as silicon oxide. As shown, the STI regions 11 fill the trenches 10 to a height just above the tunnel oxide layer 2, such that a large part of the floating gate structures 9 are still exposed.

Figure 1L:
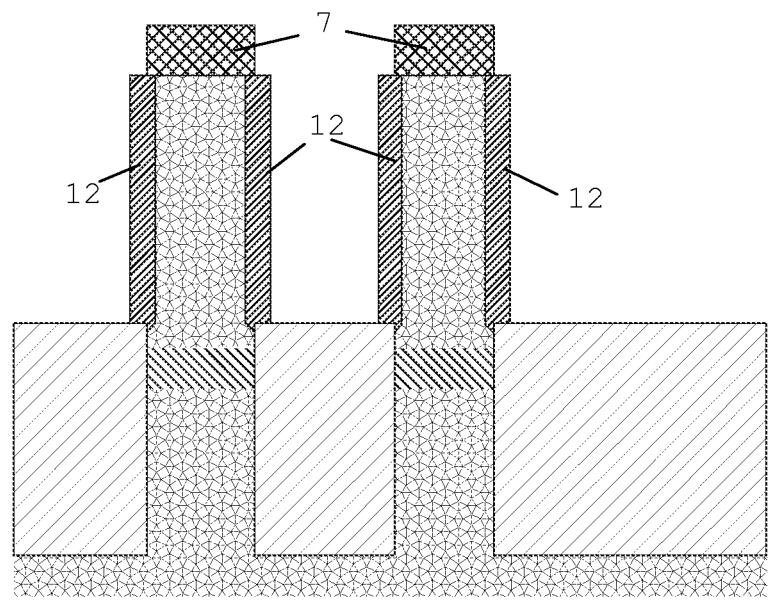

In FIG. 1L, a silicon dioxide layer 12 is formed on the sidewalls of the floating gate structures 9. The silicon dioxide layer 12 may be formed by, for example, a thermal oxidation of the semiconductor layer 6. The silicon dioxide layer 12 may have a thickness between, for example, about 5 nm and about 15 nm, or between about 5 nm and about 10 nm, or even between about 6 nm and about 8 nm.

Figure 1M:
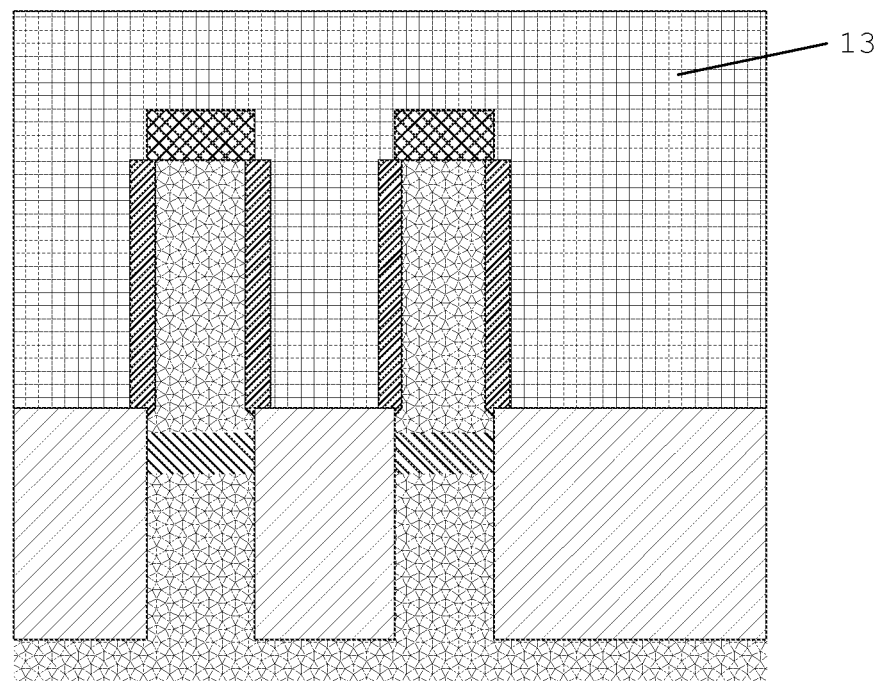

As shown in FIG. 1M, a control gate layer 13 is formed over the floating gate structures 9. The control gate layer 13 may be formed by, for example, depositing (e.g., by chemical vapor deposition) a polysilicon material that surrounds the floating gate structures 9.

As shown, the hard mask layer 7 remains on top of the floating gate structures 9. The hard mask layer 7 may prevent unwanted leakage between the top surface or top corners of the floating gate structures 9 and the control gate layer 13. For example, the hard mask layer 7 may act as an inter-poly dielectric in between the floating gate structures 9 and the control gate layer 13. In some embodiments, a thickness of the hard mask layer 7 may be greater than a thickness of the silicon dioxide layer 12. For example, the hard mask layer 7 may be about 5 nm to about 15 nm thicker than the silicon dioxide layers 12.

The method illustrated in FIGS. 1A-1M may be used to produce a dense pattern of columnar floating gate structures 9, each of which has a silicon oxide layer 12 on each side.

The floating gate structures 9 may, in some embodiments, be operated in a manner similar to NAND memory arrays. For example, the control gate 12 and the floating gate structures 9 may be formed in a direction perpendicular to the STI regions 11, such that every floating gate structure 9 is at the intersection of a portion of the substrate 1 where the STI regions 11 are not formed. The floating gate structures 9 may act as a NAND string, while the control gate 12 acts as a wordline.

The invention claimed is:

1. A method comprising:
providing a substrate comprising a monocrystalline semiconductor, wherein the monocrystalline semiconductor comprises silicon;
forming a thermally grown tunnel oxide layer on the substrate, wherein the thermally grown tunnel oxide layer comprises silicon dioxide;
depositing a protective layer on the thermally grown tunnel oxide layer, thereby forming a stack of the thermally grown tunnel oxide layer and the protective layer on the substrate, wherein the protective layer comprises polycrystalline silicon;
forming at least one opening in the stack, thereby exposing at least one portion of the substrate;
cleaning the at least one exposed portion with a cleaning liquid, wherein the protective layer is substantially unaffected by the cleaning liquid;
loading the substrate comprising the stack into an epitaxial reactor;
thereafter, performing an in-situ etch to remove the protective layer, wherein the etch is selective with respect to the thermally grown tunnel oxide layer;
using the at least one exposed portion as a source to epitaxially grow a layer comprising the monocrystalline semiconductor material; and
forming the layer comprising the monocrystalline semiconductor material into at least two columnar floating gate structures by:
planarizing the layer comprising the monocrystalline semiconductor material;
depositing on the planarized layer a hard mask layer comprising a first dielectric material;
depositing on the hard mask layer a resist layer;
patterning the resist layer;
etching the hard mask layer and the planarized layer according to the patterned resist layer to form the at least two columnar floating gate structures, wherein the hard mask layer is present on the at least two columnar floating gate structures;
etching portions of the thermally grown tunnel oxide layer to form trenches between the at least two columnar floating gate structures;
filling the trenches with a second dielectric material to form shallow trench isolation regions, wherein at least a portion of the at least two columnar floating gate structures remain exposed;
thermally growing an oxide layer on sidewalls of the at least two columnar floating gate structures; and
thereafter, depositing a control gate layer between and on top of the at least two columnar floating gate structures.

2. The method of claim 1, wherein:
the cleaning liquid comprises hydrogen fluoride; and
performing the in-situ etch comprises exposing the substrate to a halogen precursor.

3. The method of claim 2, wherein the halogen precursor comprises one of hydrogen chloride and chlorine.

4. The method of claim 1, wherein the in-situ etch being selective with respect to the thermally grown tunnel oxide layer comprises the in-situ etch having a selectivity for the protective layer over the thermally grown tunnel oxide layer of about 100:1.

5. The method of claim 1, wherein the oxide layer has a thickness between about 5 nm and about 15 nm.

6. The method of claim 1, wherein a half-pitch of the at least two columnar floating gate structures is between about 10 nm and about 20 nm.

7. The method of claim 1, further comprising:
after loading the substrate comprising the stack into the reactor and before performing the in-situ etch, annealing the substrate comprising the stack.

8. The method of claim 1, wherein the at least two columnar floating gate structures do not include the protective layer that was removed by the in-situ etch.

9. A method comprising:
providing a substrate comprising a monocrystalline semiconductor;
forming a thermally grown tunnel oxide layer on the substrate;
forming at least one opening in the thermally grown tunnel oxide layer, thereby exposing at least one portion of the substrate;
cleaning the at least one exposed portion with a cleaning liquid;
loading the substrate comprising the thermally grown tunnel oxide layer into an epitaxial reactor;
thereafter, using the at least one exposed portion as a source to epitaxially grow a layer comprising the monocrystalline semiconductor material; and
forming the layer comprising the monocrystalline semiconductor material into at least two columnar floating gate structures by:
planarizing the layer comprising the monocrystalline semiconductor material;
depositing on the planarized layer a hard mask layer comprising a first dielectric material;
depositing on the hard mask layer a resist layer;
patterning the resist layer;
etching the hard mask layer and the planarized layer according to the patterned resist layer to form the at least two columnar floating gate structures, wherein the hard mask layer is present on the at least one columnar floating gate structure;
etching portions of the thermally grown tunnel oxide layer to form trenches between the at least two columnar floating gate structures;
filling the trenches with a second dielectric material to form shallow trench isolation regions, wherein at least a portion of the at least two columnar floating gate structures remain exposed;
thermally growing an oxide layer on sidewalls of the at least two columnar floating gate structures; and
thereafter, depositing a control gate layer between and on top of the at least two columnar floating gate structures.

10. The method of claim 9, wherein the oxide layer has a thickness between about 5 nm and about 15 nm.

11. The method of claim 9, wherein the hard mask layer has a thickness that is greater than a thickness of the oxide layer.

12. The method of claim 9, wherein a half-pitch of the at least two columnar floating gate structures is between about 10 nm and about 20 nm.

13. The method of claim 9, further comprising:
after loading the substrate comprising the thermally grown tunnel oxide layer into the reactor, annealing the substrate comprising the thermally grown tunnel oxide layer.

* * * * *